United States Patent
Hodge et al.

(10) Patent No.: US 8,299,500 B2
(45) Date of Patent: Oct. 30, 2012

(54) SILICON GERMANIUM HETEROJUNCTION BIPOLAR TRANSISTOR HAVING INTERSTITIAL TRAPPING LAYER IN BASE REGION

(75) Inventors: Wade J. Hodge, Bolton, VT (US); Alvin J. Joseph, Williston, VT (US); Rajendran Krishnasamy, Essex Junction, VT (US); Qizhi Liu, Essex Junction, VT (US); Bradley A. Orner, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 11/161,936

(22) Filed: Aug. 23, 2005

(65) Prior Publication Data

US 2007/0051980 A1    Mar. 8, 2007

(51) Int. Cl.
H01L 29/737    (2006.01)

(52) U.S. Cl. ............ 257/197; 257/592; 257/E29.068; 257/E29.188

(58) Field of Classification Search .......... 257/197, 257/198, 565, 586, 590, 592, E29.001, E29.002, 257/E29.068, E29.082, E29.084, E29.085, 257/E29.086, E29.166, E29.169, E29.171, 257/E29.174, E29.183, E29.185, E29.187, 257/E29.188, E29.189, E29.19, E29.191, 257/E29.192, E29.193; 438/312
See application file for complete search history.

(56) References Cited

U.S. PATENT DOCUMENTS

| | | | |
|---|---|---|---|
| 6,316,795 B1 | 11/2001 | Croke, III | |
| 6,437,406 B1 | 8/2002 | Lee | |
| 6,465,317 B2 * | 10/2002 | Marty | 438/321 |
| 6,642,096 B2 | 11/2003 | Dutartre et al. | |
| 6,670,654 B2 | 12/2003 | Lanzerotti et al. | |
| 6,767,798 B2 | 7/2004 | Kalnitsky et al. | |
| 6,906,401 B2 | 6/2005 | Dunn et al. | |
| 2004/0192002 A1 | 9/2004 | Soman et al. | |

FOREIGN PATENT DOCUMENTS

EP    1282172    2/2003

OTHER PUBLICATIONS

Kwok K. Ng, Complete Guide to Semiconductor Devices, 2002 Wiley-Interscience, Second Edition. pp. 32 and 628. Five Total Pages Attached.*
Racanelli et al., "Ultra High Speed SiGe NPN for Advanced CMOS Technology," IEDM, Dec. 2-5 2001.
Stolk, P.A. et al, "Carbon Incorporation in Silicon for Suppressing Interstitial-enhanced Boron Diffusion", Mar. 13, 1995, Publisher: Applied Physics Letters.
Lanzerotti, et al., "Suppression of Boron Outdiffusion in SiGe HBTs by Carbon Incoporation ", "IEDM Technical Digest", Dec. 8, 1996.
Ghani, T et al, "Control of Implant-damage-enhanced boron Diffusion in Epitaxially Grown n-Si/p-Si1 xGex/n-Si Heterojuntion Bipolar Tran", "J. of Electronic Materials", Aug. 1, 1995.

* cited by examiner

*Primary Examiner* — Lynne Gurley
*Assistant Examiner* — Andrew O. Arena
(74) *Attorney, Agent, or Firm* — Law Office of Charles W. Peterson, Jr.; Anthony Canale

(57) ABSTRACT

A heterojunction bipolar transistor (HBT), an integrated circuit (IC) chip including at least one HBT and a method of forming the IC. The HBT includes an extrinsic base with one or more buried interstitial barrier layer. The extrinsic base may be heavily doped with boron and each buried interstitial barrier layer is doped with a dopant containing carbon, e.g., carbon or SiGe:C. The surface of the extrinsic base may be silicided.

20 Claims, 2 Drawing Sheets

SILICON GERMANIUM HETEROJUNCTION BIPOLAR TRANSISTOR HAVING INTERSTITIAL TRAPPING LAYER IN BASE REGION

BACKGROUND OF THE INVENTION

1. Field of the Invention

The present invention is related to a silicon germanium (SiGe) heterojunction bipolar transistor (HBT) and more particularly to improving SiGe HBT circuit performance.

2. Background Description

A typical bipolar transistor is a vertical stack of layers semiconductor material of alternating conduction type, i.e., NPN or PNP. Normally, the collector is located at the bottom of the stack with the base is sandwiched between the collector and the emitter. Forward biasing the base to emitter junction cases current to flow through that junction. Current through the base to emitter junction cases a much larger current to flow between the collector and emitter. Typically, each transistor terminal (base, emitter and collector) exhibits some inherent internal resistance. Current through an internal collector resistance, base resistance, or emitter resistance reduces the effective voltage to the respective transistor terminal. So, current flowing through any internal transistor resistance develops some voltage that reduces drive and impairs transistor performance. Consequently, internal transistor resistance is a primary limitation on performance for state of the art bipolar circuits.

Silicon Germanium (SiGe) heterojunction bipolar transistors (HBTs) have found widespread use in high speed applications and, especially in Radio Frequency (RF) applications, high speed wired data transmission, test equipment, and wireless applications. Extrinsic Base (ExB) resistance ($R_b$) has been a primary limitation of transistor performance with HBTs in particular. One way to reduce $R_b$ is to increase the extrinsic base dopant concentration, i.e., implanting a suitable dopant into the extrinsic base to drive the resistance down. For example, the extrinsic base may be implanted with a high concentration boron (B) for a typical NPN HBT. Implanting the extrinsic base also can improve the link between a polycrystalline extrinsic base and a monocrystalline intrinsic base (IB), that is doped with a lower concentration of the same type dopant.

Unfortunately, implanting dopant introduces defects to significantly increase the number of defects in the implanted material with the increase proportional to implant dose, energy, mass and etc. Also, activating the implanted ions (boron) to diffuse them into the extrinsic base, induces interstitials in the extrinsic base to migrate/diffuse into the intrinsic base, which may widen the base. Furthermore, the interstitials also may migrate from the base into active transistor regions, i.e., into the sub-collector, causing sub-collector dopant (e.g., Phosphorous, arsenic, antimony or a combination thereof) to diffuse laterally, increasing internal sub-collector resistance. This interstitial migration reduces HBT gain to further degrade device performance, both static and dynamic (AC/D) performance, dissipating any improvement that might have resulted from reducing $R_b$.

Thus, there is a need for reducing extrinsic base resistance in high frequency SiGe HBTs without impairing transistor performance.

SUMMARY OF THE INVENTION

It is a purpose of the invention to improve Silicon Germanium (SiGe) heterojunction bipolar transistor (HBT) circuit performance;

It is another purpose of the invention to reduce extrinsic base resistance in SiGe HBTs;

It is yet another purpose of the invention to reduce extrinsic base resistance in SiGe HBTs without widening the base or incurring interstitial migration into the intrinsic base;

It is yet another purpose of the invention to reduce extrinsic base resistance in SiGe HBTs without widening the collector or incurring interstitial migration into the collector;

It is yet another purpose of the invention to improve SiGe HBT circuit performance, while reducing extrinsic base resistance in circuit SiGe HBTs and without widening the base or collector and without increasing interstitial migration into the base or collector.

The present invention relates to a heterojunction bipolar transistor (HBT), an integrated circuit (IC) chip including at least one HBT and a method of forming the IC. The HBT includes an extrinsic base with one or more buried interstitial barrier layer. The extrinsic base may be heavily doped with boron and each buried interstitial barrier layer is doped with a dopant containing carbon, e.g., carbon or SiGe:C. The surface of the extrinsic base may be silicided.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
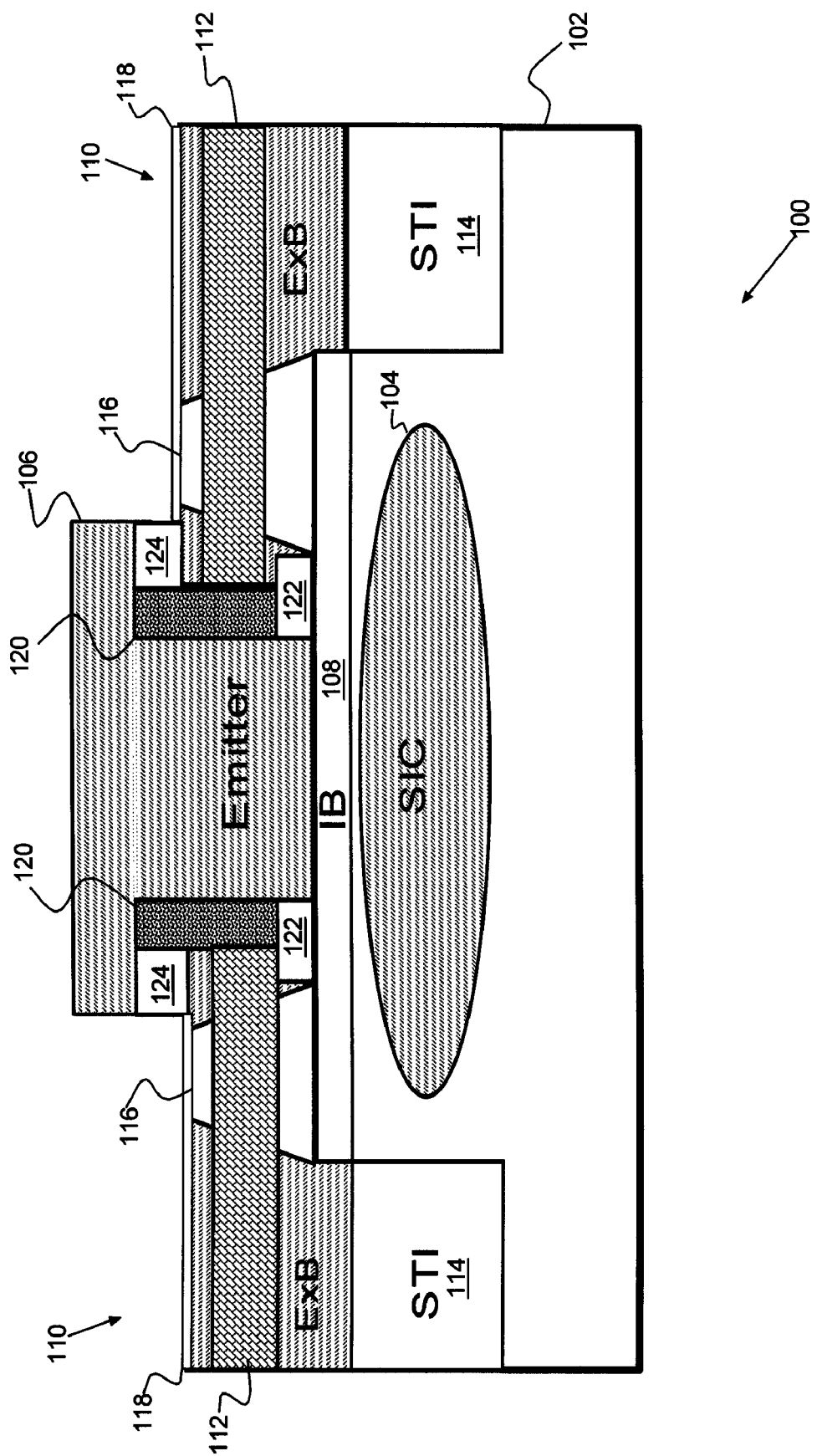
FIG. 1 shows an example of a Silicon Germanium (SiGe) heterojunction bipolar transistor (HBT) with reduced Extrinsic Base (ExB) resistance ($R_b$) according a preferred embodiment to the present invention.

Turning now to the drawings and, more particularly, FIG. 1 shows an example of a Silicon Germanium (SiGe) heterojunction bipolar transistor (HBT) 100 with reduced Extrinsic Base (ExB) resistance ($R_b$) according a preferred embodiment to the present invention. The SiGe HBT (hereinafter HBT) 100 may be one of a number of such HBTs connected to other devices including other HBTs in a typical Integrated Circuit (IC), e.g., on a BiCMOS IC chip. Each HBT 100 is formed in a surface of a semiconductor layer 102, e.g., a silicon substrate, and includes a collector/sub-collector (SiC) 104, an emitter 106 and a base sandwiched between the sub-collector 104 and emitter 106. The base includes an intrinsic base 108 and an extrinsic base 110 with an interstitial barrier 112, in this example a layer 112 containing carbon or SiGe:C, e.g., doped with C or SiGe:C to a concentration between $1 \times 10^{20}$ and $5 \times 10^{20}/cm^3$, during low-temperature (400-750° C.) epitaxial growth, and preferably, between $1 \times 10^{20}$ and $2 \times 10^{20}/cm^3$ at 400-650° C. The interstitial barrier 112 prevents or dramatically reduces interstitial migration from extrinsic base 110 into the intrinsic base 108 and sub-collector 104. Thus, with the interstitial barrier 112 trapping interstitials in the extrinsic base 110, the extrinsic base 110 may be doped to the solid solubility limit of the selected dopant. So, for example, the SiGe extrinsic base 110 may be doped with Boron (B) to the solid solubility limit of dopant without concern for interstitial migration.

Accordingly, the extrinsic base 110 is heavily implanted with boron (e.g., with a boron concentration between $1 \times 10^4$ and $5 \times 10^{15}/cm^3$ at an energy of 8-20 keV, and preferably between $1\times10^4$ and $3\times10^{15}/cm^3$ at an energy of 8-15 keV) and the implanted boron is activated, e.g., with a high temperature anneal, to reduce $R_b$ according to a preferred embodiment of the present invention. The HBT collector is defined in the upper surface of the semiconductor layer 102 by trenches 114 filled with dielectric material, e.g., shallow trenches 114 formed using typical Shallow Trench Isolation (STI) techniques. Typically, after filling the trenches 114 with dielectric material, the wafer surface is planarized using a chemical-mechanical (chem-mech) polish. The base is formed on the planarized surface as a SiGe layer of uniform thickness with extrinsic base 110 forming as polycrystalline SiGe on trenches 114 and intrinsic base 108 forming as monocrystalline SiGe on the semiconductor sub-collector 104. The polycrystalline extrinsic base 110 links through a facet region 116 to the monocrystalline intrinsic base 108. Preferably, silicide is formed on the surface 118 of the extrinsic base 110 to further reduce $R_b$. The interstitial barrier 112 of this example may be formed by in situ doping the SiGe layer with carbon as the SiGe layer is grown or by a carbon implant after base layer formation is complete. A nitride spacer or collar 120 on landing pads 122 separates and isolates the emitter 106 from the extrinsic base 110. Preferably the emitter 106 is formed by removing the upper portion of the base layer to the thickness selected for the intrinsic base 108. See, e.g., U.S. Pat. No. 6,906,401 B2 to Dunn et al., entitled "Method to Fabricate High Performance NPN Transistors in a BiCMOS Process" assigned to the assignee of the present invention and incorporated herein by reference. Dielectric spacers 124 maintain separation between the emitter 106 and the facet regions 116.

In addition to enabling heavily doping the extrinsic base with boron and further, activating the implanted boron to reduce $R_b$, the interstitial barrier 112 traps interstitials in the extrinsic base 110 to control the lateral diffusion of the n-type boron dopant of the present example into the p-type sub-collector 104. Also, the interstitial barrier 112 minimizes diffusion of sub-collector dopant (Phosphorus), to contain expansion of sub-collector 104 to intrinsic base 108 junction width and, correspondingly, minimize any increase in collector to base capacitance ($C_{cb}$). Also, the interstitial barrier 112 reduces the effects of the boron on the intrinsic base 108, i.e., limits widening the intrinsic base 108 which would otherwise reduce the unity current gain frequency (Ft) for the HBT. Further, since the unity unilateral power gain frequency, $F_{max}=(Ft/(8\pi R_b C_{cb}))^{1/2}$; $F_{max}$ is increased for a preferred HBT because Ft is maintained, while both $R_b$ and $C_{cb}$ are contained or reduced.

Figure 2:
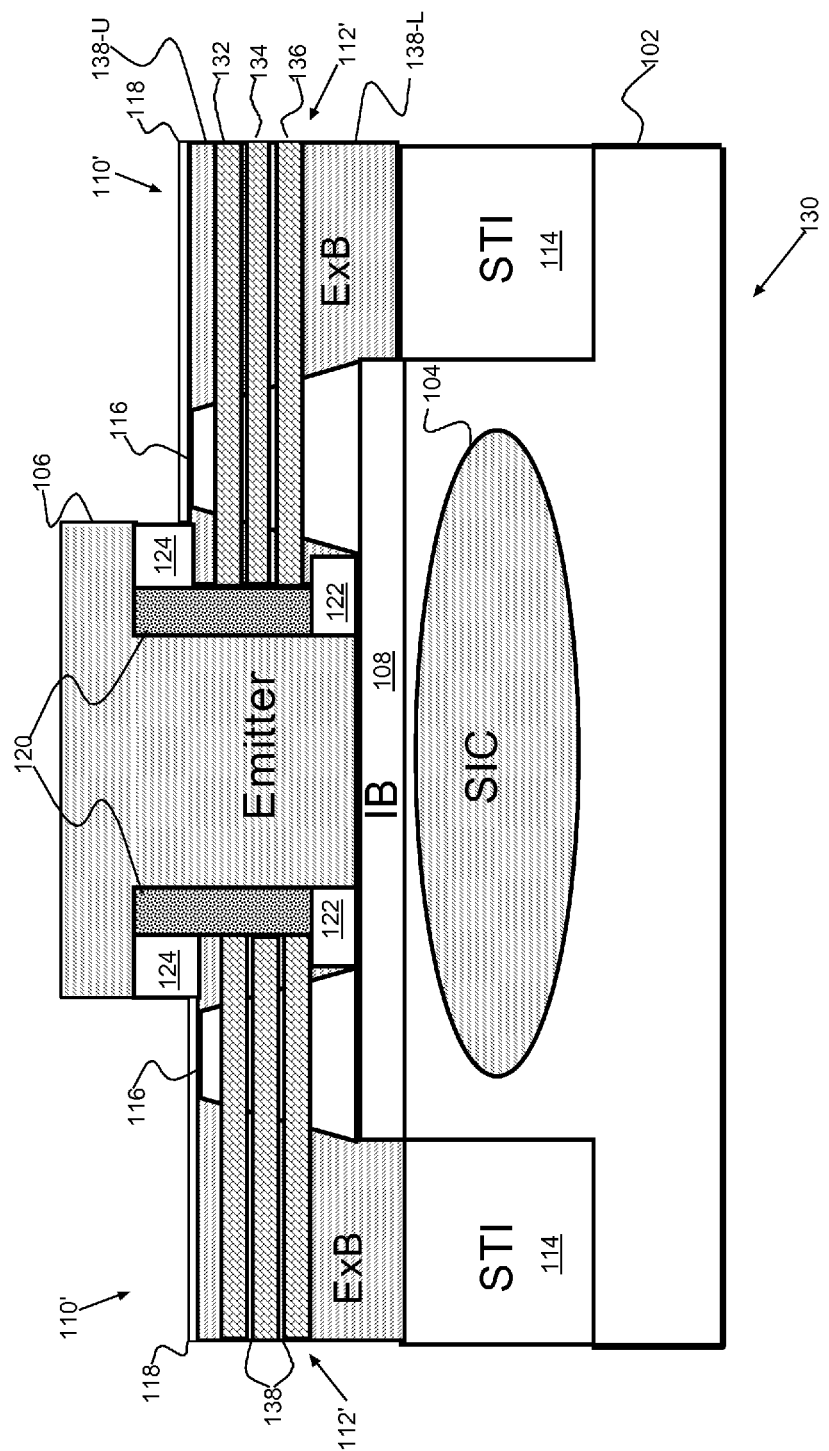
FIG. 2 shows another example of a preferred embodiment HBT.

FIG. 2 shows another example of a preferred embodiment HBT 130 with like elements labeled identically. In this example, the interstitial barrier 112' is a layered structure with multiple barrier layers 132, 134, 136 containing carbon buried in the SiGe extrinsic base 110'. Each of the multiple layers 132, 134, 136 may be ion implanted as described for the single layer 112. Alternately, the first SiGe base layer 138-L can be grown to a given thickness (e.g., 100-350 Å, and preferably, 100-250 Å) followed by a thin in situ doped (with boron) SiGe base layer 138, and repeating for the remaining layers 134, 136. Each of the multiple layers 132, 134, 136 may be formed by step doping with carbon or with SiGe:C, e.g., at a concentration between $1*10^{20}$ and $5*10^{20}/cm^3$, and during low-temperature (400-750° C. epitaxial growth, and preferably, between $1*10^{20}$ and $2*10^{20}/cm^3$ at 400-650° C. Finally, in situ doped-poly silicon or SiGe layer 138-U is grown on the multi-layered interstitial barrier 112', primarily, to facilitate silicidation. Typically, carbon or a SiGe:C layer is not suited to silicidation. This is because the agglomeration of materials that forms during barrier formation can rapidly increase the resulting base resistance to spoil the benefits of the interstitial barrier. However, this preferred embodiment HBT 130 overcomes this handicap because the contact surface layer, e.g., 134, is grown above the C or SiGe:C in the buried interstitial barrier.

In this example, although carbon diffuses faster than any other dopants, by alternating and sandwiching the interstitial barrier layers 132, 134, 136 between un-doped (with carbon or SiGe:C) extrinsic base layers, the carbon in the interstitial barrier layers 132, 134, 136 trap interstitials, which diffuse faster than carbon. So, for this multi-layer embodiment, any interstitials not trapped by upper interstitial barrier layer 136, can be easily trapped by the middle interstitial barrier layer 134, and any that escape the middle 134 are trapped by the bottom 132.

Thus, advantageously, because the interstitial barrier 112, 112' traps interstitials, $R_b$ may be reduced with a high doping concentration of boron in the extrinsic base 110. Since any carbon in the extrinsic base 110, 110' is buried in the interstitial barrier 112, 112', the extrinsic base resistance may be further reduced by silicide. Additionally, the interstitial barrier 112, 112' prevents interstitials from diffusing in the extrinsic base 110, 110' towards the intrinsic base 108 and into the sub-collector 104. This also prevents lateral diffusion of the phosphorous in the sub-collector 104 to minimize widening the collector and realize a performance gain in a preferred embodiment HBT 100. Any such performance gain was previously partially or completely negated by interstitial migration that occurred in diffusing the boron. Further, by choosing the right carbon or SiGe:C dose/energy (or concentrations), barrier layers form such that interstitials are trapped at the interface between intrinsic base 108 and extrinsic base 110. Thus, the higher dopant concentration provides an improved link between the intrinsic base 108 and the extrinsic base 110, that reduces the resistance that the link contributes to $R_b$. This reduction is in addition to the reduction realized from the dopant activation of the implanted boron in the extrinsic base 110. So, both $R_b$ and $C_{cb}$ are reduced to maintain Ft and, correspondingly, to increase $F_{max}$.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A heterojunction bipolar transistor (HBT) comprising:
a semiconductor substrate including a collector region;
an intrinsic base region formed on said collector region;
an emitter region; and
an extrinsic base region connected to said intrinsic base and formed on said substrate, said extrinsic base region comprising:
a semiconductor material layer; and
a layer of an interstitial trapping material buried within said semiconductor material layer,
wherein said semiconductor material layer directly contacts the uppermost surface of said interstitial trapping material and
the lowermost surface of said interstitial trapping material directly contacts said semiconductor layer.

2. The HBT of claim 1, wherein said interstitial trapping material comprises carbon and said intrinsic base region is free of said planar carbon layer.

3. The HBT of claim 1, wherein said extrinsic base region comprises a plurality of planar layers of said interstitial trapping material.

4. The HBT of claim 1, wherein said semiconductor material layer is doped with a dopant.

5. The HBT of claim 4, wherein said dopant comprises boron and at least a portion of said extrinsic base region comprises said planar layer sandwiched between portions of said semiconductor material layer, said portions being above and below the sandwiched portion of said planar layer.

6. The HBT of claim 5, wherein said extrinsic base region is doped with boron to a solid solubility limit of boron in said semiconductor material.

7. The HBT of claim 1, wherein said intrinsic base region is a SiGe layer free of said planar layer.

8. The HBT of claim 1, wherein said emitter region is disposed over said intrinsic base region.

9. An integrated circuit (IC) chip including at least one heterojunction bipolar transistor (HBT), said HBT comprising:
    a collector at a surface of a semiconductor material layer;
    an intrinsic base region formed on said surface above said collector;
    an emitter disposed above said intrinsic base;
    a doped extrinsic base connected to said intrinsic base; and
    an interstitial barrier buried in said doped extrinsic base,
    wherein said extrinsic base directly contacts the uppermost surface of said interstitial barrier and
    the lowermost surface of said interstitial barrier directly contacts said extrinsic base.

10. An IC as in claim 9, wherein said planar interstitial barrier comprises at least one planar layer of interstitial trapping material.

11. An IC as in claim 10, wherein said at least one layer comprises a plurality of interstitial trapping material layers.

12. An IC as in claim 10, wherein said interstitial trapping material comprises carbon.

13. An IC as in claim 10, wherein said interstitial trapping material comprises SiGe:C and said intrinsic base region is free of said planar SiGe:C layer.

14. An IC as in claim 13, wherein said doped extrinsic base and said intrinsic base comprise SiGe.

15. An IC as in claim 9, wherein said doped extrinsic base is doped with boron and at least a portion of said extrinsic base region comprises said planar layer sandwiched between portions of said semiconductor material layer, said portions being above and below the sandwiched portion of said planar layer.

16. An IC as in claim 9, further comprising a silicide layer on said doped extrinsic base.

17. A heterojunction bipolar transistor (HBT) comprising:
    a semiconductor substrate including a collector region;
    shallow trench isolation (STI) regions in a surface of said semiconductor substrate defining an HBT collector;
    an intrinsic base on said HBT collector;
    an emitter on said intrinsic base; and
    an extrinsic base on said surface and connected to said intrinsic base, said extrinsic base comprising:
    a semiconductor material layer doped with a dopant to a solid solubility limit of said dopant in said semiconductor material;
    a layer of an interstitial trapping material buried within said semiconductor material layer,
    wherein said semiconductor material layer directly contacts the uppermost surface of said interstitial trapping material and
    the lowermost surface of said interstitial trapping material directly contacts said semiconductor layer; and
    a silicide layer on said semiconductor material layer.

18. The HBT of claim 17, wherein said semiconductor substrate is a silicon substrate and includes a sub-collector beneath said HBT collector, said intrinsic base is a monocrystalline SiGe layer, said extrinsic base comprises polycrystalline SiGe and a nitride collar on landing pads on said intrinsic base encloses said emitter.

19. The HBT of claim 18, wherein said interstitial trapping material comprises carbon (SiGe:C), said dopant comprises boron and at least a portion of said extrinsic base region comprises said planar layer sandwiched between portions of said semiconductor material layer, said portions being above and below the sandwiched portion of said planar layer.

20. The HBT of claim 19, wherein said extrinsic base region comprises a plurality of layers of said interstitial trapping material.

* * * * *